(12) United States Patent
Li

(10) Patent No.: US 9,490,271 B2
(45) Date of Patent: Nov. 8, 2016

(54) ARRAY SUBSTRATE HAVING JUMP WIRE CONNECTING FIRST AND SECOND WIRINGS

(71) Applicant: SHENZHEN CHINA STAR OPTOELECTRONICS TECHNOLOGY CO., LTD., Shenzhen (CN)

(72) Inventor: Jinlei Li, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,898

(22) PCT Filed: Aug. 20, 2014

(86) PCT No.: PCT/CN2014/084821
§ 371 (c)(1),
(2) Date: Jan. 23, 2015

(87) PCT Pub. No.: WO2016/011692
PCT Pub. Date: Jan. 28, 2016

(65) Prior Publication Data
US 2016/0027797 A1    Jan. 28, 2016

(30) Foreign Application Priority Data

Jul. 22, 2014 (CN) .......................... 2014 1 0351748

(51) Int. Cl.
*H01L 27/12* (2006.01)
*H01L 21/208* (2006.01)
(Continued)

(52) U.S. Cl.
CPC ........... *H01L 27/124* (2013.01); *G02F 1/1362* (2013.01); *G02F 1/13439* (2013.01);
(Continued)

(58) Field of Classification Search
CPC ............. H01L 27/124; H01L 27/1288; H01L 21/308; G02F 1/13439; G02F 1/136227
See application file for complete search history.

(56) References Cited

U.S. PATENT DOCUMENTS

| 6,683,660 B1 | 1/2004 | Furuhashi et al. |
| 2006/0139551 A1* | 6/2006 | Kimura ................. G02F 1/1345 349/149 |

(Continued)

FOREIGN PATENT DOCUMENTS

| CN | 101060124 A | 10/2007 |
| CN | 102023401 A | 4/2011 |

(Continued)

OTHER PUBLICATIONS

International Search Report (Forms PCT/ISA/210 and PCT/ISA/220) and the Written Opinion (Form PCT/ISA/237) issued on Apr. 27, 2015, by the State Intellectual Property Office of China acting as the International Searching Authority in corresponding International Application No. PCT/CN2014/084821. (12 pages).

*Primary Examiner* — Kevin Parendo
(74) *Attorney, Agent, or Firm* — Buchanan Ingersoll & Rooney PC

(57) ABSTRACT

The present disclosure discloses an array substrate, manufacturing method thereof, and display device. The array substrate comprises: a first wiring and a second wiring located in a first metal layer; a first insulating layer covering the first metal layer, wherein the first insulating layer is provided with via holes corresponding to the first wiring and the second wiring respectively; and a jumper located in a second metal layer provided on the first insulating layer, wherein the jumper is connected with the first wiring and the second wiring through the via holes, thereby the first wiring and the second wiring being electrically conducted with each other through the jumper. The array substrate of the present disclosure can be used in liquid crystal television, liquid crystal display, mobile phone, tablet personal computer and other display devices.

4 Claims, 3 Drawing Sheets

(51) Int. Cl.
  *G02F 1/1333* (2006.01)
  *G02F 1/1343* (2006.01)
  *G02F 1/1362* (2006.01)
  *H01L 21/308* (2006.01)
  *H01L 29/66* (2006.01)
  *H01L 29/786* (2006.01)

(52) U.S. Cl.
  CPC ... *G02F1/133345* (2013.01); *G02F 1/136204* (2013.01); *H01L 21/308* (2013.01); *H01L 27/1288* (2013.01); *H01L 29/66765* (2013.01); *H01L 29/78669* (2013.01)

(56) References Cited

U.S. PATENT DOCUMENTS

| | | | |
|---|---|---|---|
| 2006/0252168 A1 | 11/2006 | Rhee et al. | |
| 2007/0002223 A1* | 1/2007 | Park | G02F 1/133345 349/114 |
| 2010/0003792 A1* | 1/2010 | Lai | G02F 1/136209 438/160 |
| 2010/0009481 A1* | 1/2010 | Tseng | H01L 27/1288 438/34 |
| 2014/0160377 A1* | 6/2014 | Yamagishi | G06F 3/044 349/12 |
| 2014/0183537 A1* | 7/2014 | Jang | H01L 27/124 257/59 |
| 2015/0062457 A1* | 3/2015 | Kida | G06F 3/044 349/12 |
| 2015/0179666 A1 | 6/2015 | Chai | |

FOREIGN PATENT DOCUMENTS

| | | |
|---|---|---|
| CN | 102023429 A | 4/2011 |
| CN | 102751241 A | 10/2012 |
| CN | 103760693 A | 4/2014 |
| JP | 2001-320059 A | 11/2001 |

* cited by examiner

ARRAY SUBSTRATE HAVING JUMP WIRE CONNECTING FIRST AND SECOND WIRINGS

CROSS REFERENCE TO RELATED APPLICATION

The present application claims benefit of Chinese patent application CN 201410351748.6, entitled "Array Substrate, Manufacturing Method Thereof, and Display Device" and filed on Jul. 22, 2014, which is incorporated herein by reference.

FIELD OF THE INVENTION

The present disclosure relates to the technical field of display technology, and particularly to an array substrate, a method for manufacturing the array substrate, and a display device.

BACKGROUND OF THE INVENTION

With the development of display technology, liquid crystal display has become the most commonly used display device.

The array substrate, comprising a display area and a peripheral area (non-display area), is an important component of liquid crystal display device. The array substrate is provided with a plurality of wirings on its peripheral area, and some of these wirings need to be connected. As shown in FIG. 1, on a base substrate 100, a first wiring 11 and a second wiring 12 located in a first metal layer (a gate metal layer) need to be connected with each other. However, the first wiring 11 and the second wiring 12 are separated by a third wiring 13. Therefore, the first wiring 11 and the second wiring 12 need to be connected by a jumper. In an existing method thereof, a first insulating layer 2 covering the first metal layer is provided with a jumper 3, which is located in a second metal layer (a source-drain metal layer) that is covered with a second insulating layer 4. Then, via holes 51 penetrating the first insulating layer 2 and the second insulating layer 4 and via holes 52 penetrating the second insulating layer 4 are formed. Finally, the first wiring 11 and the second wiring 12 are both connected with the jumper 3 by transparent electrodes 6 through via holes 51 and 52, so that the first wiring 11 and the second wiring 12 are connected with each other.

Indium tin oxide (ITO) and indium zinc oxide (IZO), whose resistivity are higher than metal by two orders of magnitude, are usually chosen as the material of the transparent electrode 6. Consequently, the contact impedance between the first wiring 11 and the jumper 3 and the contact impedance between the second wiring 12 and the jumper 3 are relatively high, which is not conducive to the transmission of electric signals and also raises total power consumption of the array substrate.

SUMMARY OF THE INVENTION

The purpose of the present disclosure is to provide an array substrate, a method for manufacturing the array substrate, and a display device, so as to solve the technical problem of high impedance of jumper joints in existing array substrate.

The present disclosure provides an array substrate, comprising:

a first wiring and a second wiring located in a first metal layer;

a first insulating layer covering said first metal layer, wherein said first insulating layer is provided with via holes corresponding to said first wiring and said second wiring respectively; and a jumper located in a second metal layer provided on said first insulating layer, wherein said jumper is connected with said first wiring and said second wiring through said via holes, thereby said first wiring and said second wiring being electrically conducted with each other through said jumper.

Further, said array substrate comprises a second insulating layer covering said second metal layer.

Further, said array substrate comprises a transparent electrode layer located on said second insulating layer.

Preferably, said first wiring, said second wiring and said jumper are all located in an edge region of said array substrate.

The present disclosure also provides a method for manufacturing an array substrate, comprising the steps of:

step 1, patterning a first metal layer on a substrate, the first metal layer comprising a first wiring and a second wiring;

step 2, patterning a first insulating layer covering said first metal layer, the first insulating layer comprising via holes corresponding to said first wiring and said second wiring respectively; and step 3, patterning a second metal layer on said first insulating layer, the second metal layer comprising a jumper connected with said first wiring and said second wiring through said via holes, thereby said first wiring and said second wiring being electrically conducted with each other through said jumper.

Preferably, said step 2 comprises:

forming a first insulating layer covering said first metal layer;

forming an active layer covering said first insulating layer;

coating said active layer with photoresist;

exposing said photoresist with a gray-scale photomask;

developing said photoresist and removing photoresist from the region of said via holes;

etching the active layer and the first insulating layer away from said region of via holes, thereby forming via holes corresponding to said first wiring and said second wiring respectively;

aching said photoresist and removing photoresist from insulating region;

etching the active layer away from said insulating region; and removing residual photoresist.

Further, said manufacturing method comprises:

step 4, patterning a second insulating layer covering said second metal layer.

Further, said manufacturing method comprises:

step 5, patterning a transparent electrode layer on said second insulating layer.

Preferably, said first wiring, said second wiring and said jumper are all located in an edge region of said array substrate.

The present disclosure also provides a display device, comprising a color film substrate and said array substrate.

The beneficial effect achieved by the present disclosure is as follows. According to the array substrate provided by the present disclosure, the jumper located in the second metal layer directly contacts with the first wiring and the second wiring through via holes arranged on the first insulating layer, and no transparent electrode is necessary to connect the jumper with the first wiring and the second wiring. In this manner, not only the structure of the array substrate is simplified, but also the contact impedance between the jumper and the first wiring and the contact impedance between the jumper and the second wiring are reduced, so that the reliability of the transmission of electric signals is improved and the total power consumption of the array substrate is reduced.

Other features and advantages of the present disclosure will be stated in the following description, and part of them will become obvious in the description or become understandable through the embodiments of the present disclosure. The objectives and other advantages of the present disclosure can be achieved and obtained through the structures specified in the description, claims and drawings.

BRIEF DESCRIPTION OF THE DRAWINGS

The drawings necessary for explaining the embodiments are introduced below to interpret the technical solutions of the embodiments of the present disclosure more clearly.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It is important to note that as long as there is no structural conflict, all the technical features mentioned in all the embodiments may be combined together in any manner, and the technical solutions obtained in this manner all fall within the scope of the present disclosure.

Figure 2:
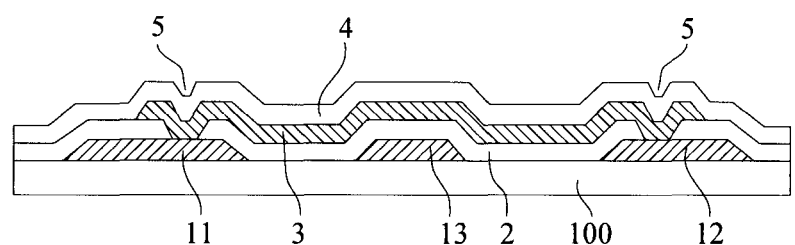
FIG. 2 is a schematic diagram of jumper joints of the array substrate provided by an embodiment of the present disclosure.

The array substrate provided by an embodiment according to the present disclosure comprises a display area, and a peripheral area (i.e., an edge region of the array substrate). In the present embodiment, jumper joints are used in the peripheral area of the array substrate. Specifically, as shown in FIG. 2, the jumper joint comprises a base substrate 100, a first wiring 11, a second wiring 12 and a third wiring 13 all located in a first metal layer (a gate metal layer), a first insulating layer 2 (a gate insulating layer) covering the first metal layer, and a jumper 3 located in a second metal layer (a source-drain metal layer) provided on the first insulating layer 2.

The first insulating layer 2 is provided with via holes 5 corresponding to the first wiring 11 and the second wiring 12 respectively. The jumper 3 runs over the third wiring 13, and connects the first wiring 11 with the second wiring 12 through via holes 5. Therefore, the first wiring 11 and the second wiring 12 are electrically conducted with each other through the jumper 3.

In addition, the array substrate further comprises a second insulating layer 4 (a passivation layer) covering the second metal layer, and a transparent electrode layer (not shown in FIG. 2) located on the second insulating layer 4.

In the array substrate provided by the embodiment of the present disclosure, the jumper 3 directly contacts with the first wiring 11 and the second wiring 12 through respective via holes 5, and thus no transparent electrode is necessary to connect the jumper 3 with the first wiring 11 and the second wiring 12. In this manner, not only the structure of the array substrate is simplified, but also the contact impedance between the jumper 3 and the first wiring 11 and the contact impedance between the jumper 3 and the second wiring 12 are reduced, so that the reliability of the transmission of electric signals is improved and the total power consumption of the array substrate is reduced.

Figure 1:
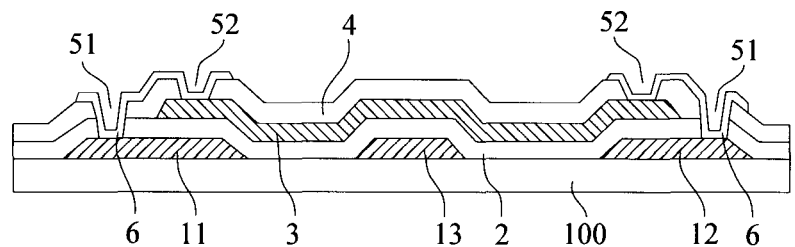
FIG. 1 is a schematic diagram of jumper joints of an array substrate in the prior art.

Moreover, in the prior art, e.g., as shown in FIG. 1, since the resistivity of the transparent electrode 6 is higher than the resistivity of metal, the jumper joints have to be provided with a large number of via holes of high density to reduce the contact impedance between the first metal layer and the second metal layer to a certain extent. However, via holes are formed by electrically charged particles through dry etching technique. To ensure the first insulating layer 2 and the second insulating layer 4 being completely etched out, the over-etching technique is normally used. In this manner, the charged particles will contact with the first metal layer and the second metal layer excessively, so that electrical charges will accumulate on the first metal layer and the second metal layer. The more via holes there are, the more electrical charges would accumulate. Excessive electrical charges accumulation would lead to Electro-Static Discharge (ESD) at jumper joints or other positions of the array substrate, and bring about adverse consequences such as break down and short circuit, thus reducing the qualified rate of the array substrate.

Compared with the prior art, the jumper 3 directly contact with the first wiring 11 and the second wiring 12 in the present embodiment, and the contact impedance thereof is small. Thus, there is no need to arrange a large number of via holes, and the number of electrical charges accumulated during the etching process of via holes 5 is very small. Therefore, Electro-Static Discharge can be avoided effectively, and the qualified rate of the array substrate can be improved.

As shown in FIG. 3a to FIG. 3h, the embodiment of the present disclosure also provides a method of manufacturing said array substrate, comprising the following steps.

Figure 3A:
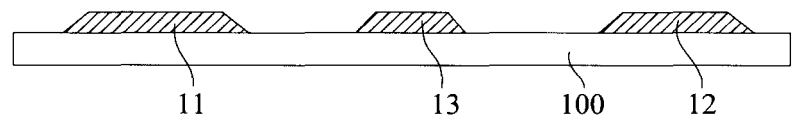
FIG. 3a to FIG. 3h are schematic diagrams showing a process of manufacturing the array substrate provided by an embodiment of the present disclosure.

In step S1, as shown in FIG. 3a, a first metal layer is patterned on a base substrate 100.

Conventional patterning technology can be used in step S1, and the pattern of the first metal layer is formed after exposing, developing, etching and other processes. The pattern of the first metal layer formed thereby comprises gate lines and common electrode lines (not shown in FIG. 3a) located in a display area of the array substrate, and a first wiring 11, a second wiring 12 and a third wiring 13 located in a peripheral area of the array substrate.

In step S2, a first insulating layer is patterned to cover the first metal layer, and the first insulating layer comprises via holes corresponding to the first wiring and the second wiring respectively.

In the present embodiment, the pattern of the first insulating layer and the pattern of an active layer are formed in one single patterning procedure. Step S2 specifically comprises the following sub-steps.

Figure 3B:
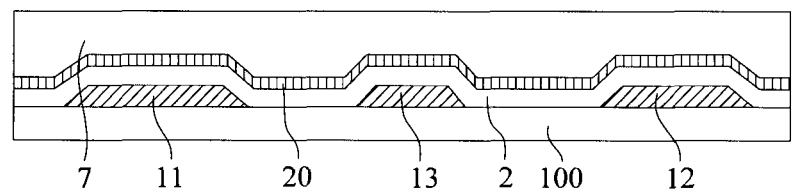

In sub-step S21: as shown in FIG. 3b, a first insulating layer 2 is formed to cover said first metal layer, with a thickness preferably ranging from 3000 Å to 4000 Å.

In sub-step S22: an active layer 20 is formed to cover the first insulating layer 2.

The active layer 20 specifically comprises a semiconductor layer (an amorphous silicon layer) and a doped semiconductor layer (a phosphorus doped amorphous silicon layer), wherein the thickness of the semiconductor layer preferably ranges from 1000 Å to 1500 Å, and the thickness of the doped semiconductor layer preferably ranges from 300 Å to 500 Å.

In sub-step S23, the active layer 20 is coated with photoresist 7, the thickness of which preferably ranges from 1.5 μm to 2.2 μm.

In sub-step S24, the photoresist is exposed with a gray-scale photomask.

In the gray-scale photomask used in the present embodiment, a transparent region of the gray-scale photomask corresponds to the region of via holes of the jumper joints, an opaque region thereof corresponds to a silicon island region of a thin film transistor, and the rest region thereof is a semi-transparent region corresponding to the insulating region of the array substrate.

After the photoresist is exposed by the gray-scale photomask as mentioned above, the photoresist in the region of via holes is exposed completely, the photoresist in the insulating region is exposed partly, and the photoresist in the silicon island region is not exposed.

In sub-step S25, the photoresist is developed.

Figure 3C:
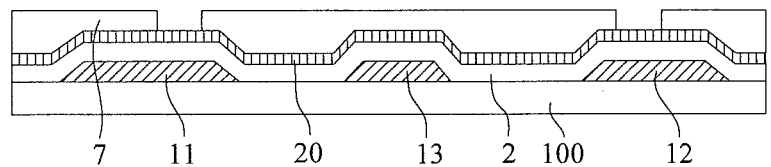

After the photoresist 7 is developed, in view of the gray-scale photomask used in sub-step S24, the photoresist in the region of via holes is removed completely; part of the photoresist in the insulating region is removed, so that the thickness of the remaining photoresist in the insulating region ranges from 0.3 μm to 0.7 μm, as shown in FIG. 3c; and the photoresist in the silicon island region (not shown in FIG. 3c) is retained completely, and the thickness thereof still ranges from 1.5 μm to 2.2 μm.

Figure 3D:
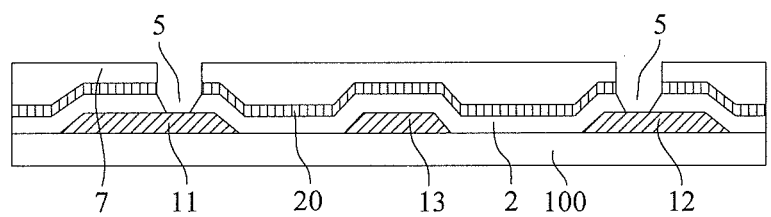

In sub-step S26, the active layer 20 and the first insulating layer 2 are etched away from the region of via holes, thereby forming via holes 5 corresponding to the first wiring 11 and the second wiring 12 respectively, as shown in FIG. 3d.

The active layer 20 and the first insulating layer 2 are etched away from the region of via holes by electrically charged particles through dry etching technique. To ensure the first insulating layer 2 being completely etched out, the over-etching technique may be used. However, since there are only two via holes 5 in the array substrate of the present embodiment, the number of electrical charges accumulated on the first wiring 11 and the second wiring 12 is very small. Therefore, Electro-Static Discharge can be avoided effectively, and the qualified rate of the array substrate can be improved.

In sub-step S27, an ashing treatment is carried out for the photoresist 7.

Figure 3E:
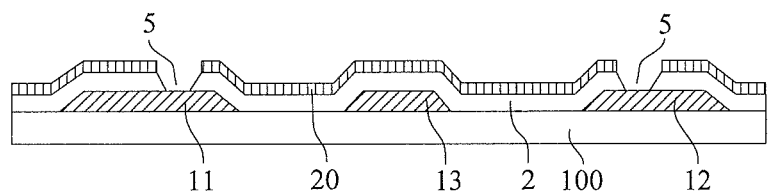

Specifically, the thickness of the photoresist 7 is reduced through ashing treatment, so that the photoresist in the insulating region are removed, as shown in FIG. 3e. At the same time, the thickness of the photoresist in the silicon island region is reduced also, but the photoresist is not removed completely.

Figure 3F:
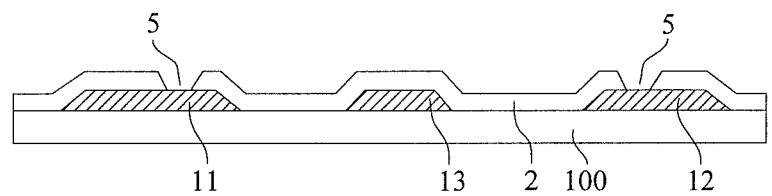

In sub-step S28, the active layer 20 is etched away from the insulating region, as shown in FIG. 3f.

The active layer 20 is etched away from the insulating region by electrically charged particles through dry etching technique. Compared with sub-step S26, the etching time of the present sub-step is relatively short. Therefore, only the active layer 20 is etched away from the insulating region, while the first insulating layer 2 is retained on the insulating region.

In sub-step S29, residual photoresist is removed (away from the silicon island region) by ashing treatment.

In step S3, a second metal layer is patterned on the first insulating layer 2.

Figure 3G:
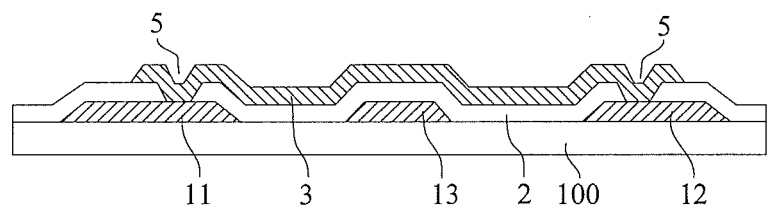

The second metal layer comprises data lines, sources and drains (not shown in FIG. 3g) located in the display area, and a jumper 3 located in the peripheral area. The jumper 3 is connected with the first wiring 11 and the second wiring 12 through via holes 5, thereby the first wiring 11 and the second wiring 12 being electrically conducted through the jumper 3, as shown in FIG. 3g.

Moreover, the method of manufacturing the array substrate can further comprise the following steps.

Figure 3H:
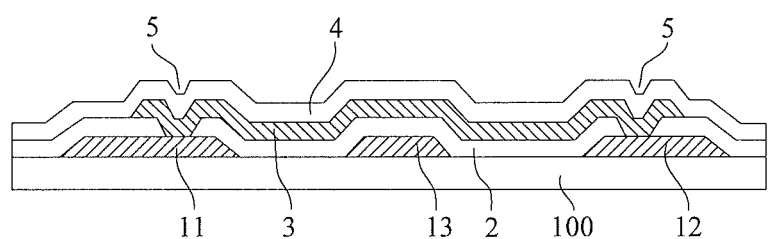

In step S4, as shown in FIG. 3h, a second insulating layer 4 is patterned to cover the second metal layer. The second insulating layer 4 comprises a via hole for each pixel located in the display area, and probably via holes located in the peripheral area for other uses (different from jumper connection).

In step S5, a transparent electrode layer is patterned on the second insulating layer. The transparent electrode layer comprises a pixel electrode for each pixel located in the display area, and probably electrodes located in the peripheral area for other uses (different from jumper connection).

Conventional patterning technology can be used in aforesaid steps S3, S4, and S5, comprising exposing, developing, etching and other processes.

The array substrate provided by the embodiment of the present disclosure can be manufactured by said manufacturing method. Therefore, the structure of the array substrate is simplified, the contact impedance between the jumper and the first wiring and the contact impedance between the jumper and the second wiring are reduced, and the qualified rate of the array substrate is improved accordingly. Furthermore, in the present manufacturing method, the array substrate is manufactured only through five patterning procedures with five photomasks. Therefore, the manufacturing cost and manufacturing difficulty of the array substrate would not increase owing to structural changes of the jumper joints.

The embodiment of the present disclosure also provides a display device, specifically including liquid crystal television, liquid crystal display, mobile phone, tablet personal computer and so on. The display device comprises a color film substrate, the array substrate provided by the embodiment of the present disclosure and other components.

The display device and the array substrate provided by the embodiment of the present disclosure share the same technical features, and thus they can both solve the same technical problem and achieve the same technical effect.

The present disclosure discloses the embodiments hereinabove, but the embodiments are adopted to facilitate the understanding of the present disclosure, rather than to limit it. Any one skilled in the art may make any modifications and changes to the forms and details of the embodiments without departing from the spirit and scope of the present disclosure. The protection scope of the present disclosure shall be determined by the scope as defined in the claims.

The invention claimed is:

1. A method for manufacturing an array substrate, comprising the steps of:
   step (a), patterning a first metal layer on a substrate, the first metal layer comprising a first wiring and a second wiring;
   step (b), patterning a first insulating layer covering said first metal layer, the first insulating layer comprising via holes corresponding to said first wiring and said second wiring respectively; and
   step (c), patterning a second metal layer on said first insulating layer, the second metal layer comprising a jumper connected with said first wiring and said second wiring through said via holes, thereby said first wiring and said second wiring being electrically conducted with each other through said jumper,
   wherein said step (b) comprises:
   forming the first insulating layer covering said first metal layer;
   forming an active layer covering said first insulating layer;
   coating said active layer with photoresist;
   exposing said photoresist with a gray-scale photomask;
   developing said photoresist and removing photoresist from the region of said via holes:
   etching the active layer and the first insulating layer away from said region of via holes, thereby forming the via holes corresponding to said first wiring and said second wiring respectively;
   ashing said photoresist and removing photoresist from insulating region;
   etching the active layer away from said insulating region; and
   removing residual photoresist.

2. The method according to claim 1, further comprising:
   step (d), patterning a second insulating layer covering said second metal layer.

3. The method according to claim 2, further comprising:
   step (e), patterning a transparent electrode layer on said second insulating layer.

4. The method according to claim 1, wherein said first wiring, said second wiring and said jumper are all located in an edge region of said array substrate; and
   wherein the edge region is a non-display area of the array substrate.

* * * * *